(12) United States Patent
Leung et al.

(10) Patent No.: US 7,212,061 B2
(45) Date of Patent: May 1, 2007

(54) DPWM WITH LEADING EDGE BLANKER CIRCUIT

(75) Inventors: Kafai Leung, Austin, TX (US); Ka Y. Leung, Austin, TX (US); Jinwen Xiao, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 107 days.

(21) Appl. No.: 11/096,187

(22) Filed: Mar. 31, 2005

(65) Prior Publication Data

US 2006/0022732 A1   Feb. 2, 2006

Related U.S. Application Data

(60) Provisional application No. 60/591,463, filed on Jul. 27, 2004.

(51) Int. Cl.
*H03K 17/16* (2006.01)
*G05F 1/10* (2006.01)

(52) U.S. Cl. .................................. 327/380; 327/538

(58) Field of Classification Search ........ 327/379–381, 327/77, 387, 50, 51, 54, 322, 538, 543; 361/18; 323/282–286
See application file for complete search history.

(56) References Cited

U.S. PATENT DOCUMENTS 4,630,187 A    12/1986   Henze

| 6,144,245 | A  | * | 11/2000 | Balogh ....................... 327/380 |
|---|---|---|---|---|
| 2004/0095122 | A1 | | 5/2004 | Chapuis |
| 2004/0155637 | A1 | | 8/2004 | Chapuis |
| 2004/0196014 | A1 | | 10/2004 | Chapuis |

OTHER PUBLICATIONS

Aleksandar Prodic, et al.; Mixed-Signal Simulation of Digitally Controlled Switching Converters; Colorado Power Electronics Center, Department of Electrical and Computer Engineering, University of Colorado at Boulder; Boulder, CO 80309-0425, USA.

Patella, B.J. et al.; High-Frequency Digital PWM Controller IC for DC-DC Converters; Power Electronics, IEEE, vol. 18, Issue 1; pp. 438-446; Jan. 2003.

Albert M. Wu, et al.; Digital PWM Control: Application in Voltage Regulation Modules; Department of Electrrical Engineering and Computer Sciences, University of California, Berkeley; IEEE 1999.

F. Baronti, et al.; DC/DC Switching Power Converter with Radiation Hardened Digital Control Based on SRAM FPGAs; P/MAPLD 2004.

(Continued)

*Primary Examiner*—David Mis
(74) *Attorney, Agent, or Firm*—Howison & Arnott, LLP

(57) ABSTRACT

An apparatus for providing over current protection for a digital pulse width modulator is disclosed. The apparatus includes first logic circuitry for generating a primary interrupt indicating that a detected output current is greater than a threshold current. Second logic circuitry blanks out current spikes in the output current occurring on a leading pulse edge of at least one of a plurality of outputs of the digital pulse-width modulator.

12 Claims, 5 Drawing Sheets

OTHER PUBLICATIONS

Angel V. Peterchev, et al.; Quantization Resolution and Limit Cycling in Digitally Controlled PWM Converters: Department of Electrical Engineering and Computer Science, University of California, Berkeley.

Biranchinath Sahu, et al.; Adaptive Power Management of Linear RF Power Amplifiers in Mobile Handsets: An Integrated System Design Approach; Georgia Tech Analog and Power IC Design Laboratory, School of Electrical and Computer Engineering, Georgia Institute of Technology; Submission for IEEE Asia Pacific 2004.

Aleksandar Prodic, et al.; Design of a Digital PID Regulator Based on Look-Up Tables for Control of High-Frequency DC-DC Converters; Colorado Power Electronics Center, Department of Electrixcal and Computer Engineering, University of Colorado; Boulder, CO 80309; 0425; USA.

John Sustersic, et al.; Design and Implementation of a Digital Controller for DC-to-DC Power Converters; NASA Clen Research Center, Robert Button; The Advanced Engineering Research Laboratory, Cleveland State University. Copyright 2000 Society of Automotive Engineers, Inc.

Gu-Yeon Wei, et al.; A Fully Digital, Energy-Efficient, Adaptive Power-Supply Regulator; IEEE Journal of Solid State Circuits, vol. 34, No. 4, Apr. 1999.

Dragan Maksimovic, et al.; Custom IC Blocks for Enabling Digital Control in Switching Power Converters; Colorado Power Electronics Center, University of Colorado, Boulder, Jul. 11, 2003.

LM2636 5-Bit Programmable Synchronous Buck Regulator Controller, National Semiconductor, Mar. 2005; 2005 National Semiconductor Corporation.

Jinwen Xiao, et al.; An Ultra-Low-Power Digitally-Controlled Buck Converter IC for Cellular Phone Applications; University of California, Berkeley; IEEE 2004.

Jinwen Xiao, et al.; Architecture and IC Implementation of a Digital VRM Controller, Department of Electrical Engineering and Computer Science, University of California, Berkeley; IEEE 2001.

* cited by examiner

DPWM WITH LEADING EDGE BLANKER CIRCUIT

RELATED APPLICATIONS

This application claims priority from U.S. Provisional Application No. 60/591,463 entitled "Digital Power Supply Controller," which is incorporated herein by reference.

TECHNICAL FIELD OF THE INVENTION

The present invention relates to digital pulse width modulators, and more particularly, to protection for digital pulse width modulators against over current, over voltage and temperature.

BACKGROUND OF THE INVENTION

The digital pulse width modulator (DPWM) is capable of generating a plurality of phased outputs from a provided input. The manner of output provided by the DPWM is controlled by values provided to the DPWM from a control register. When located within a control loop of a switched power supply, the digital pulse width modulator may be exposed to operating conditions such as over current, over voltage and extreme temperatures, which may be detrimental to the continued operation of the DPWM. Thus, there is a need for some type of manner for providing protections against these extreme operating conditions for a DPWM.

SUMMARY OF THE INVENTION

The present invention disclosed and claimed herein, in one aspect thereof, comprises an apparatus for providing over current protection for a digital pulse width modulator. The device includes first logic circuitry that generates a primary interrupt indicating a detected output current is greater than a threshold current. Second logic circuitry blanks out current spikes in the output current occurring on a leading pulse edge of at least one of a plurality of outputs of the digital pulse-width modulator.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
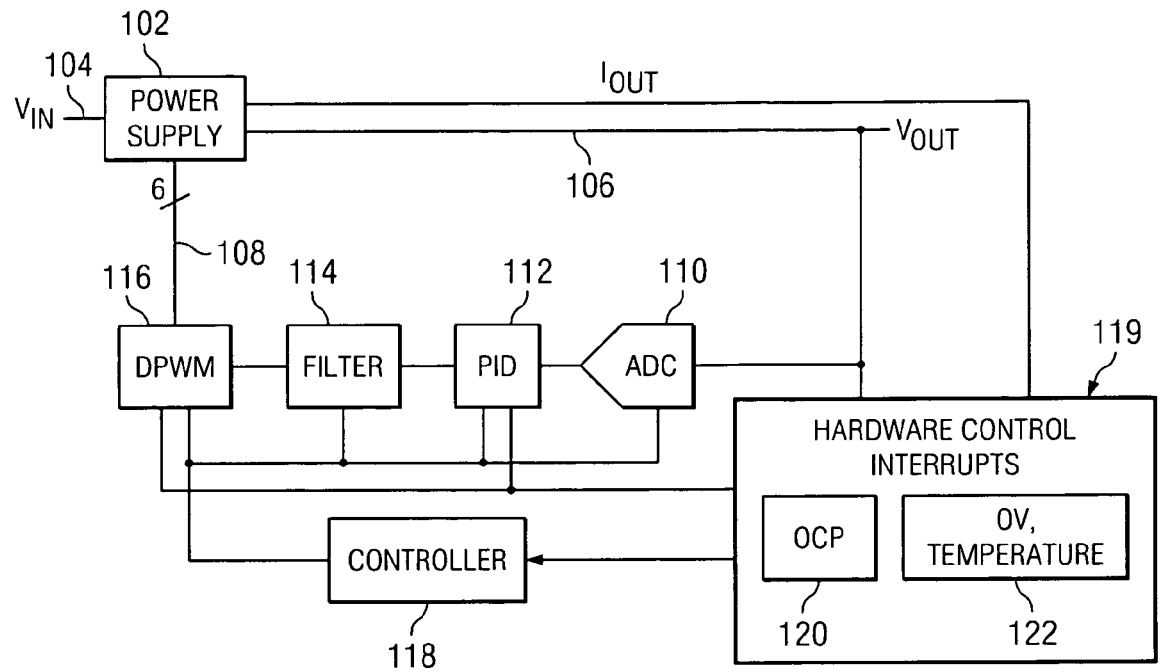
FIG. 1 is a functional block diagram of a switched power supply having a digital controller.

Referring now to the drawings, and more particularly to FIG. 1, there is illustrated a schematic block diagram of a switched power supply including a digital feedback loop. The switched power supply 102 has an input port 104 for receiving an input voltage $V_{IN}$ and an output port 106 for providing an output voltage $V_{OUT}$. A digital control loop is provided for the switched power supply between the output port 106 and a control input 108. The digital control loop consists of an A/D converter for converting the analog output voltage signal into a digital signal. Connected to the output of the A/D converter 110 is a proportional integral derivative engine (PID) 112. The proportional integral derivative engine 112 has its output connected to a filter 114, and the output of the filter 114 is provided to the input of the digital pulse width modulator (DPWM) 116. The output of the DPWM 116 is provided to the power supply 102 via control input 108. While the DPWM 116 in FIG. 1 is illustrated as having a single input to the power supply, in practice, the DPWM of the present disclosure provides six phase outputs to switching transistors of the power supply 102. The operation of the DPWM 116, filter 114, PID 112 and A/D converter 110 are each controlled by a controller 118. The controller 118 provides control values to control registers (not shown) for each of the described devices in accordance with provided source code to the controller 118. Hardware control interrupts 119 provide various control interrupts to the controller 118 and the elements of the digital control loop. Over current protection circuitry 120 monitors the output current of the power supply 102 via a hall sensor. The over current protection circuitry 120 provides inputs to the controller 118, PID 112 and DPWM 116 to control the operation of these devices during the occurrence of an over current condition. The over voltage and temperature protection circuitry 122 provide control interrupts to the controller 118 when the sensed or input voltages become too high or when the temperature of the device exceeds desired operation conditions of the switched power supply. The over voltage and temperature protections operate using special function registers to be described more fully herein below.

Figure 2:
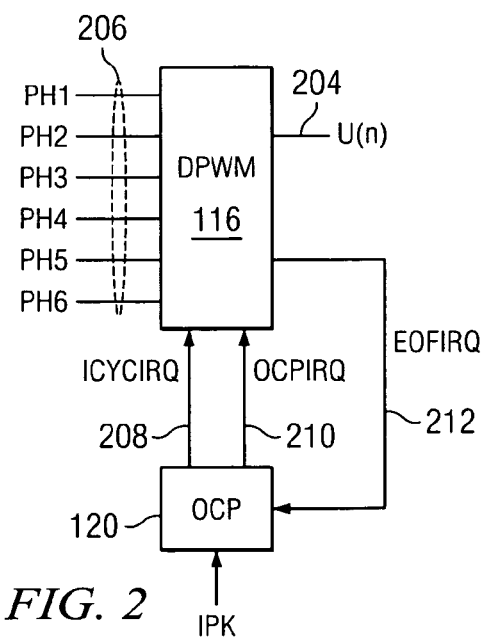
FIG. 2 illustrates a digital pulse width modulator having over current protection circuitry associated therewith.

Referring now to FIG. 2, there is more fully illustrated the digital pulse width modulator 116 of FIG. 1. The DPWM 1 16 operates in response to provided control values and an input u(n) 204. In response to the input u(n) 204, the DPWM generates a plurality of output waveforms on output lines 206 labeled PH1–PH6. The output waveforms provided from output ports 206 are provided to the gates of switching transistors within the switched power supply 102. The DPWM 116 is additionally provided control inputs ICY-CIRQ 208 and OCPIRQ 210. ICYCIRQ 208 is the primary interrupt provided by the over current protection circuitry 120. OCPIRQ 210 comprises the secondary interrupt from the over current protection circuitry 120. These interrupts enable the DPWM 116 to be controlled in a fashion to protect the internal circuitry of the DPWM 116 responsive to over current conditions. The DPWM 116 additionally provides the signal EOFIRQ 212 which is an end of frame interrupt to the over current protection 120 to assist in the generation of the primary and secondary interrupts and provide an indication of the end of a frame.

Figure 3A:
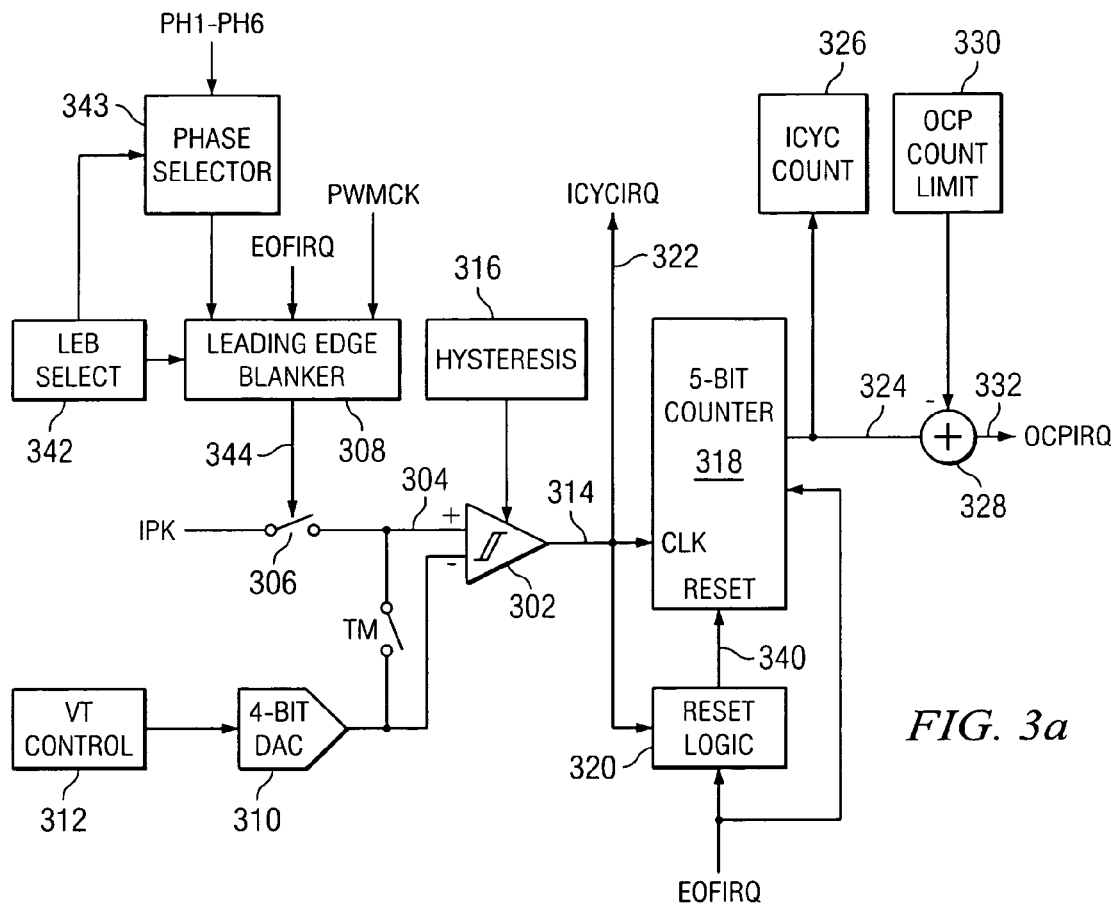
FIG. 3a is a functional block diagram of over current protection circuitry.

Referring now to FIG. 3a, there is more fully illustrated the over current protection circuitry 120 of the digital pulse width modulator circuit 116. The over current protection circuitry 120 has provided thereto a voltage related to the output current IPK of the switched power supply 102. The output current IPK is measured via a hall sensor which provides the measured current output. The voltage related to the output current IPK is provided to the positive input of a comparator 302 via input line 304. The switch 306 on the input line 304 is associated with the leading edge blanker circuit 308 which will be more fully discussed herein below. The negative input of the comparator 302 is connected to the output of a 4-bit programmable digital to analog controller (DAC) 310. The 4-bit programmable DAC 310 provides a voltage related to the threshold current $I_{TH}$ to the negative input of comparator 302. The 4-bit programmable DAC 310 is programmed to provide a desired threshold by a control register 312 having a control value stored therein. The comparator 302 compares the provided voltage related to the output current IPK of the switched power supply 102 with the programmed voltage related to the threshold current $I_{TH}$ and when the voltage related to IPK exceeds the voltage related to the threshold current $I_{TH}$, a primary interrupt (ICYCIRQ) is generated on line 314 from the output of comparator 302. The value to which the voltage related to the $I_{TH}$ current is programmed by the digital to analog controller 310 is based upon the limits of the power supply 102 to which the DPWM is connected. Hysteresis for the comparator 302 is controlled from hysteresis control values from a control register 316. The primary interrupt (ICYCIRQ) is provided to a clock input of 5-bit counter 318. The primary interrupt (ICYCIRQ) is also provided to the input of reset logic 320. The primary interrupt is output via line 322 to the DPWM 116, the controller 118 and to the integrator stage of the PID 112.

The 5-bit control register 318 monitors the number of occurrences of the primary interrupt. The present count for the number of occurrences is provided as an output on line 324. The present primary interrupt count is stored within a control register 326 called ICYC count. The present ICYC count on line 324 is compared at a comparator 328 with an over current protection count limit provided from register 330. The OCP current limit comprises the maximum number of occurrences of primary interrupt ICYCIRQ in consecutive frames that may occur. The present ICYC count from the 5-bit counter 318 is compared with the OCP count limit, which is stored in register 330, at comparator 328, and if the ICYC count from the 5-bit counter 318 equals the OCP count limit, a secondary interrupt OCPIRQ is generated from the comparator 328 on output line 332. The secondary over current interrupt is provided to the DPWM 116 to indicate the occurrence of a serious over current condition.

The primary over protection interrupt ICYCIRQ provides an indication of over current conditions which may or may not fix themselves in a next frame period. The occurrence of consecutive primary interrupt conditions are monitored by the 5-bit counter 318 such that when a predetermined number of primary interrupts have occurred, the secondary interrupt OCPIRQ may be generated to indicate a more serious over current problem such as a dead short. The primary interrupt ICYCIRQ performs a number of functions within the switch power supply device described with respect to FIG. 1. The primary interrupt ICYCIRQ is provided to the DPWM 116 such that each of the switches connected to the phase outputs of the DPWM 116 are turned off. Additionally, the primary interrupt ICYCIRQ is provided to the PID 112 to hold the integrator to prevent it from overloading.

Figure 3B:
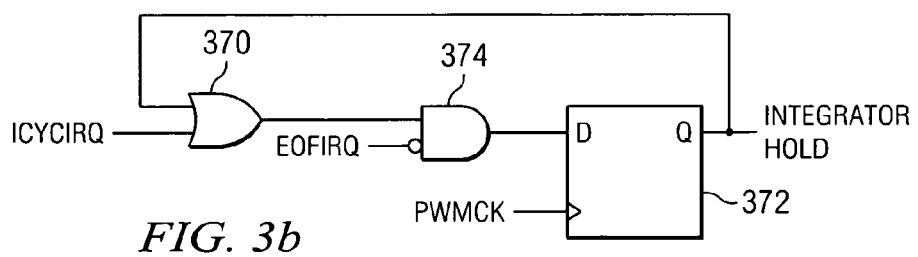
FIG. 3b illustrates an integrator hold circuit responsive to the primary interrupt.

Referring now to FIG. 3b, there is illustrated the circuit for providing the integrated hold to the ID 112. The primary interrupt ICYCIRQ is applied to a first input of OR gate 370. The second input of OR gate 370 is connected to the integrator hold output from a latch 372. The output comprises the Q output of the latch 372. The output of OR gate 370 is applied to an input of AND gate 374. The other input of AND gate 374 is an inverted input of the end of frame interrupt EOFIRQ. The output of AND gate 374 is connected to the D input of latch 372. A clock signal PWMCK is applied to the clock input of the latch 372.

Figure 3C:
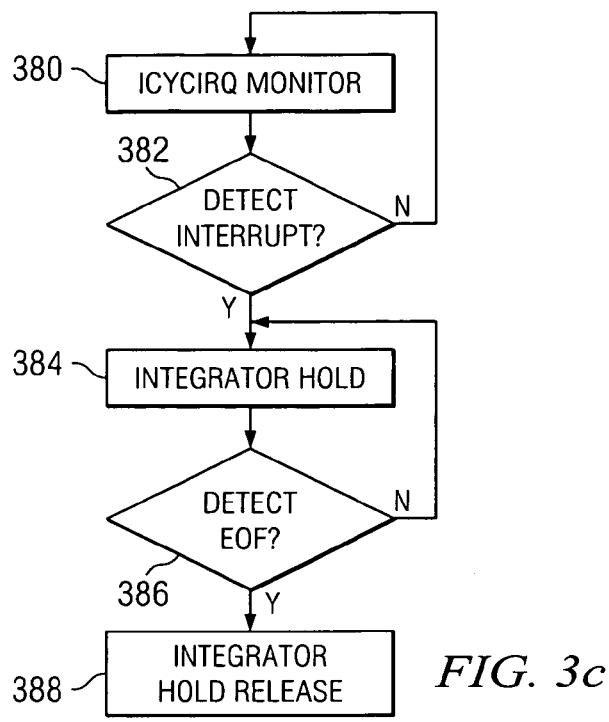
FIG. 3c is a flow diagram illustrating the operation of the integrator hold circuit of FIG. 3b.

FIG. 3c describes the operation of the circuit of FIG. 3b. At step 380, the integrator hold circuit monitors for the primary interrupt ICYCIRQ. Inquiry step 382 determines if the ICYCIRQ interrupt has been detected. If not, control passes back to step 380. Once the primary interrupt is detected, the integrator hold circuit is initiated at step 384. Once the integrator hold circuit has been initiated, inquiry step 386 determines if the end of frame interrupt has been received. If not, the integrator hold circuit remains active at step 384. Once the end of frame interrupt is detected, the integrator hold circuit is released at step 388.

Figure 4:
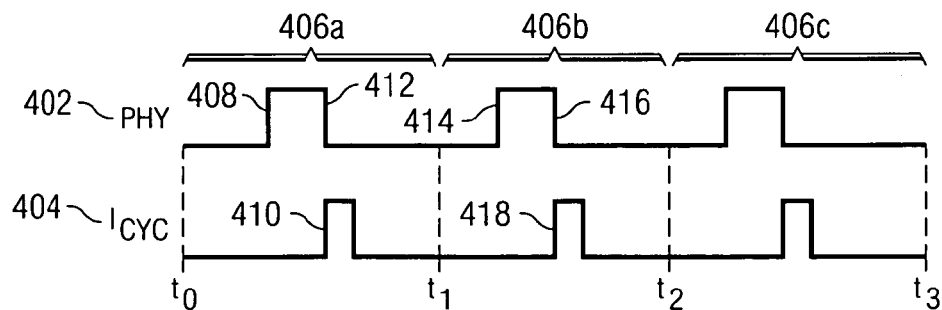
FIG. 4 is a timing diagram illustrating the operation of a phase output of the digital pulse width modulator responsive to an over current detection signal.

This is more fully illustrated in FIG. 4 where there is shown the pulsed output 402 associated with PH X which could be any phase outputs of the DPWM 116, and the primary interrupt signal ICYCIRQ provided from the output of the comparator 302. FIG. 4 illustrates three seperate frame periods. Occurring from times $T_0$ to $T_1$ is a first frame 406a, from time $T_1$ to time $T_2$ is a second frame 406b and from time period $T_2$ to time period $T_3$ is a third frame 406c. During time frame 406a, a switch connected to the output of PH X would be turned on by the rising pulse edge 408. Upon detection of a pulse indicating a primary interrupt at rising edge 410, the switch connected with output PH X would be turned off by the signal being driven low at 412 by the DPWM 116. Likewise, in frame 406b, the switch associated with DPWM output PH X would be turned on at 414 and turned off at 416 responsive to detection of the primary interrupt ICYCIRQ at 418. The turning off of a switch in response to detection of the ICYC interrupt occurs similarly in frame 406c.

If the over current condition continues over multiple frames and the secondary interrupt OCPIRQ is generated, this signal is provided to the DPWM 116 which then has the option of immediately stopping operation of the DPWM upon receipt of the secondary interrupt OCPIRQ, or alternatively, may wait to cease operation of the DPWM at the end of the next frame. Whether the DPWM ceases operation right away or at the end of the frame is programmable by the user.

Referring now back to FIG. 3a, the reset logic 322 is responsive to the primary interrupt ICYCIRQ and the end of frame interrupt EOFIRQ provided from the DPWM 116 to reset the 5-bit counter to "0" when pulses of the primary interrupt ICYCIRQ are no longer received in consecutive frames. Thus, if the reset logic 320 within a previous frame has detected occurrence of a primary interrupt ICYCIRQ, and in the next frame, as indicated by the occurrence of the end of frame interrupt EOFIRQ, there is detected no occurrence of the primary interrupt ICYCIRQ, the reset logic 320 provides a signal to the reset input of the 5-bit counter 318 via line 340 to reset the 5-bit counter to "0." The end of frame interrupt EOFIRQ is additionally provided as an input to the 5-bit counter 318. This enables the 5-bit counter to only count a single occurrence of the primary interrupt ICYCIRQ within a particular frame. If the 5-bit counter 318 had already counted the occurrence of a primary interrupt ICYCIRQ during a single frame period and receives a second primary interrupt pulse, the counter 318 will not count this pulse since the counter had not received an end of frame interrupt since receiving the last ICYCIRQ primary interrupt.

The leading edge blanker circuit 308 mentioned herein above receives an input from the leading edge blanker select register 342. The leading edge blanker select register 342 provides a control input for actuating or not actuating the leading edge blanker circuit 308. The leading edge blanker select register 342 also provides an indication to the phase selector 343 of the phase output of the DPWM 116 that is to be blanked. The phase selector 343 is connected to receive each of the PH1–PH6 outputs of the DPWM 116, such that the leading edge blanker circuit may know when to actuate a leading edge blanker output via output 344 to switch 306 corresponding to a leading edge on one of these phase outputs. The leading edge blanker select register 342 also provides the length of the blanking time of the blanking pulse. Additionally, the leading edge blanker circuit 308 receives an input from the end of frame interrupt EOFIRQ to indicate when a frame has ended. This enables the leading edge blanker circuit 308 to know when to begin looking for a next leading edge pulse. Finally, the PWMCK is a clock input clocking operations of the leading edge blanker circuit 308. The output of the leading edge blanker circuit 308 is provided to switch 306 to provide an open switch condition at switch 306 to keep the input of the comparator 302 from seeing a spiked current output on the IPK line. This is more fully illustrated in FIG. 5.

Figure 5:
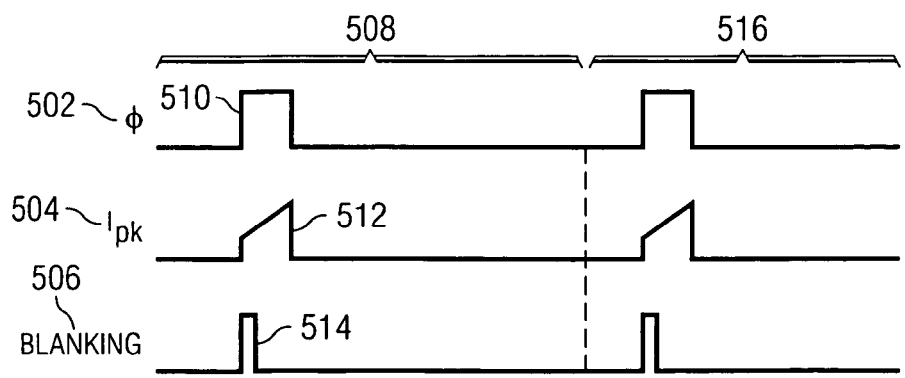
FIG. 5 is a timing diagram illustrating the use of a blanking pulse.

FIG. 5 illustrates the output of one of the phase outputs from the DPWM 502, the output current IPK 504 and the blanking signal 506. Within a first frame 508, the phase output of one of the outputs of the DPWM circuit 116 goes high at 510. This comprises the leading edge of this switching pulse. In response to the output 502 going high at 510, a current spike 512 due to parasitic capacitance is created at the current output IPK. If the voltage related to the current spike 512 were applied to the input of the comparator 302, the comparator 302 might inadvertently register an over current condition responsive to the current spike even though no over current condition actually existed. A blanking pulse is provided from the leading edge blanker circuit 308 via the output 344 to the blanking switch 306 to set the switch to an open condition to keep the comparator 302 from monitoring the current spike on IPK. The current blanking pulse 514 will only open the blanking switch 306 during the time of current spike 512. The remainder of the time the switch is closed enabling the comparator 302 to compare the output current to the threshold current. The operation of the blanking signal 506 in the following frame 516 occurs in a similar fashion. The phase blanked by the leading edge blanker circuit 308 and the length of the blanking pulse 514 are each programmable by the user through the LEB select register 342. The blanking circuit 308 may also detect a falling edge signal that comprises a leading edge signal.

Figure 6:
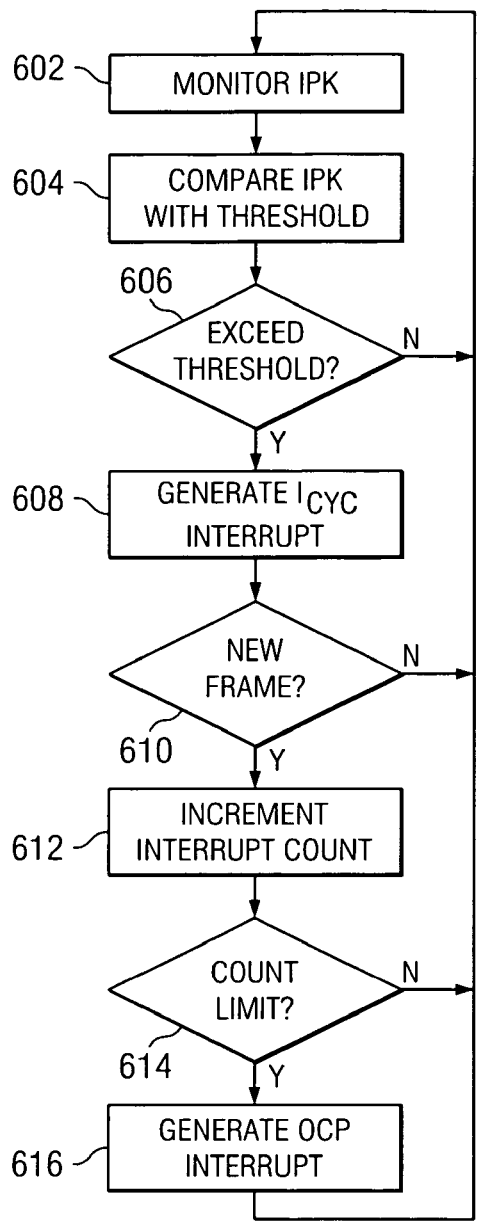
FIG. 6 is a flow diagram illustrating the generation of primary and secondary interrupts by the over current protection circuitry.

Referring now to FIG. 6, there is illustrated a flow diagram describing the operation of the over current protection circuitry in the manner for generating both the primary interrupt ICYCIRQ and the secondary interrupt OCPIRQ. The leading edge blanker circuit initially monitors at step 602 the output current IPK. The output current IPK is compared at step 604 with the threshold current $I_{TH}$ to determine whether the output current exceeds the threshold current. If inquiry step 606 determines that the output current does not exceed the threshold current, control passes back to monitoring step 602.

Once the inquiry step 606 determines that the output current has exceeded the threshold current, a primary interrupt ICYCIRQ is generated at step 608. Inquiry step 610 determines if the interrupt is occurring within a new frame. If not, control passes back to monitoring step 602 to continue to monitor for the occurrence of a primary interrupt in a new frame. If inquiry step 610 determines that the primary interrupt has occurred within a new frame, the interrupt count is incremented at step 610.

Next, at inquiry step 614, a determination is made if the interrupt count has reached the count limit. If not, control returns to monitoring step 602 to begin monitoring for a next interrupt pulse. If the interrupt count limit has been equaled, a secondary interrupt OCPIRQ is generated at step 616. The controller 118 will reset the OCPIRQ when the OCP condition is removed, and process flow returns to monitoring step 602 to continue monitoring the output current.

Figure 7:
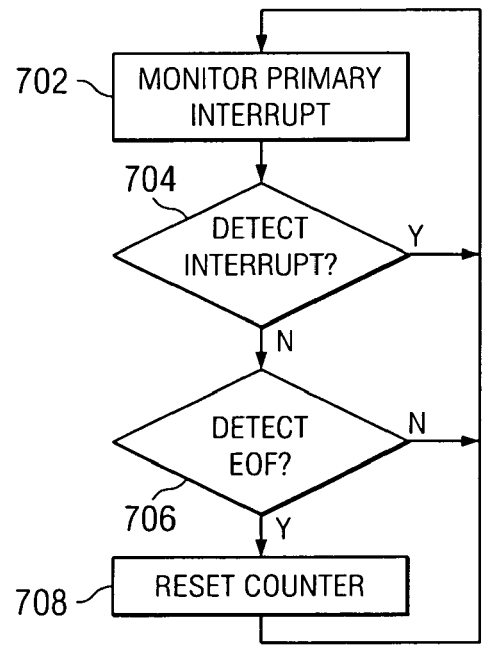
FIG. 7 is a flow diagram illustrating the operation of the reset circuitry of the over current protection circuitry.

Referring now to FIG. 7, there is illustrated the process of operation of the reset logic 320. The reset logic 320 monitors at step 702 the occurrence of the primary interrupt from the comparator 302. If inquiry step 704 detects an interrupt, control passes back to monitoring step 702. If no interrupt is detected, inquiry step 706 determines if an end of frame interrupt has been received by the reset logic 320. If no end of frame interrupt has been received, control passes back to step 702 to continue monitoring the primary interrupt output. When inquiry step 706 detects an occurrence of an end of frame interrupt and no primary interrupt has been detected within that frame, the counter 318 is reset at step 708. Control then returns to monitoring step 702 to repeat the process.

Figure 8:
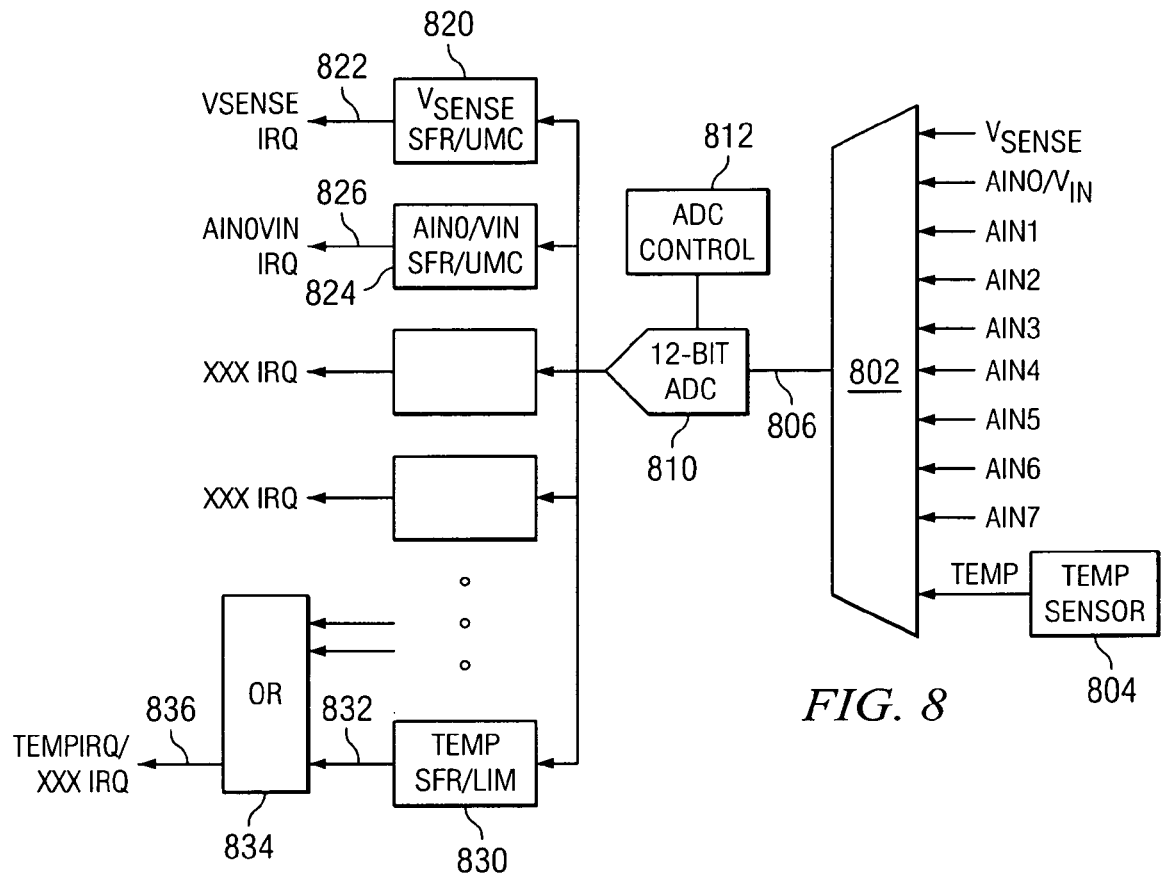
FIG. 8 is a functional block diagram illustrating the circuitry for providing over voltage and over temperature protections for a digital pulse with modulator.

Referring now to FIG. 8, there is illustrated the circuitry for providing both over voltage and temperature protection for the DPWM 116. A number of analog signals are applied to the input of a multiplexor 802. These signals are provided from various analog outputs and include a VSENSE input sensing the output voltage of the switched power supply and an AINO/VIN input which is monitoring the input voltage of the switched power supply. Also, a TEMP signal is provided by a temperature sensor 804 that measures the temperature of the device. These signals are multiplexed to the output 806 of the multiplexor 802 and provided to the input of a 12 bit analog to digital converter (ADC) 810. The 12 bit ADC 810 is controlled from values from an ADC control register 812. The output of the 12 bit ADC is a digital output which is applied to the input of a special function register/limit (SFR/LIM) register set. There are a number of SFR/LIM register sets associated with output of the ADC 810. Each of the SFR/LIM register sets are associated with one of the input analog signals provided to the multiplexor 802. The SFR/LIM register sets have stored therein a limit value. The SFR/LIM register set compares a provided input from the ADC 810 to this limit value, and if the limit value is exceeded, generates an associated interrupt signal at the output of the SFR/LIM register set.

Thus, when the VSENSE signal is applied to the input of the 12 bit ADC 810, a digital VSENSE signal is applied to the input of SFR/LIM register set 820. The SFR/LIM register set 820 compares the provided digital value of VSENSE to the predetermined value stored within the register set 820. If the provided value exceeds the stored value, a VSENSEIRQ is generated at output 822. If the provided value does not exceed the stored limit value in register set 820, no VSENSEIRQ is generated. Likewise, if the VIN value is applied to the input of the 12 bit ADC 810, the digitized value is applied to the input of SFR/LIM 824. If the provided digital value of the VIN exceeds the stored limit value in the register set 824, a AIN0/VINIRQ is generated at output 826. The remaining SFR/LIM register sets operate in a similar manner responsive to a digital input that is compared to a limit value stored within the register set. When the limit value is exceeded an appropriate interrupt is generated.

When the temperature value is applied to the input of 12 bit ADC 810, the digitized temperature signal is applied to the input of the TEMP SFR/LIM register set 830. As described previously, this value is compared with a temperature limit value in the register set 830, and if this value is exceeded, a TEMPIRQ is generated at output 832. However, the output of the TEMP SFR/LIM register set 830 is connected to the input of an OR gate 834. This is due to the fact that not enough interrupt resources are available for each of the SFR/LIM register set, so a limited number of the register sets have their outputs applied to the input of OR gate 834. The interrupt provided to the input of OR gate 834 is also provided at the output 836 of OR gate 834. Thus, when the TEMP's IRQ is applied to input 832, it will also be provided at the output pin 836. When a digital value is applied to a particular SFR/LIM register set, the remaining SFR/LIM register sets are each disabled. Thus, when a digital signal associated with a particular register set is being applied, that register set is the only register set which is presently enabled.

Figure 9:
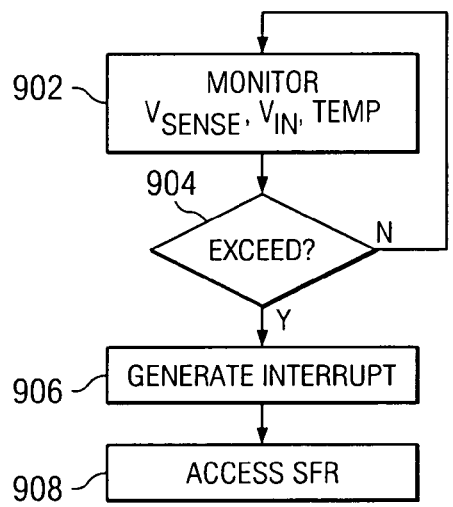
FIG. 9 is a flow diagram illustrating the method for providing over voltage and over temperature protections.

Referring now to FIG. 9, there is more fully illustrated the process of operation of the SFR/LIM register sets. Initially, at step 902 each of the VSENSE input voltage, the input voltage VIN and the temperature are monitored by the above-described circuitry. When a particular SFR/LIM register set determines at inquiry step 904 that a limit value has been exceeded, the interrupt is generated at step 906. If inquiry step 904 determines that no value has been exceeded, control passes back to the monitoring step 902. Once the interrupt 906 has been generated and provided to the controller 118 of the switched power supply, the controller will access at step 908 the special function register set to determine what the present problem may be.

Although the preferred embodiment has been described in detail, it should be understood that various changes, substitutions and alterations can be made therein without departing from the scope of the invention as defined by the appended claims.

What is claimed is:

1. The an apparatus for providing over-current protection for a digital pulse-width modulator, comprising:
   first logic circuitry for generating an interrupt indicating an output current is greater than a threshold current; and
   second logic circuitry for blanking out current spikes in the output current occurring on a leading pulse edge of at least one of a plurality of outputs of the digital pulse-width modulator;
   said second logic circuitry comprising:
      a leading edge blanker circuit for generating a switch output in a first mode and a second mode responsive to occurrence of the leading pulse edge of at least one of a plurality of outputs of the digital pulse-width modulator; and
      a switch connected to an input for the output current of the first logic circuitry responsive to the switch output in the first mode for opening the switch and responsive to the switch output in the second mode for closing the switch.

2. An apparatus for providing over-current protection for a digital pulse-width modulator, comprising:
   first logic circuitry for generating an interrupt indicating an output current is greater than a threshold current; and
   second logic circuitry for blanking out current spikes in the output current occurring on a leading pulse edge of at least one of a plurality of outputs of the digital pulse-width modulator;
   wherein the at least one of the plurality of outputs of the digital pulse-width modulator that has current spikes blanked out there from is user programmable responsive to a control register input.

3. An apparatus for providing over-current protection for a digital pulse-width modulator, comprising:
   first logic circuitry for generating an interrupt indicating an output current is greater than a threshold current;
   second logic circuitry for blanking out current spikes in the output current occurring on a leading pulse edge of at least one of a plurality of outputs of the digital pulse-width modulator; and
   a control register for controlling actuation of the second logic circuitry.

4. An apparatus for providing over-current protection for a digital pulse-width modulator, comprising:
   first logic circuitry for generating an interrupt indicating an output current is greater than a threshold current; and
   second logic circuitry for blanking out current spikes in the output current occurring on a leading pulse edge of at least one of a plurality of outputs of the digital pulse-width modulator;
   wherein the second logic circuitry determines the leading pulse edge of at least one of the plurality of outputs responsive to an output for each of the plurality of outputs of the digital pulse-width modulator and an end-of-frame interrupt indicating an end of a frame.

5. The apparatus of claim 4, wherein the second logic circuitry determines a first edge occurring on at least one of the plurality of outputs after the end-of-frame interrupt as the leading pulse edge.

6. An apparatus for providing over-current protection for a digital pulse-width modulator, comprising:
   first logic circuitry for generating an interrupt indicating an output current is greater than a threshold current; and
   second logic circuitry for blanking out current spikes in the output current occurring on a leading pulse edge of at least one of a plurality of outputs of the digital pulse-width modulator;
   wherein the first logic circuitry further comprises:
      a comparator for comparing the detected output current to the threshold current and for generating the interrupt indicating the detected output current is greater than the threshold current, and
      a digital to analog converter for providing the threshold current.

7. An apparatus comprising:
   a switched power supply;
   a digital control loop connected to the switched power supply, the digital control loop including a digital pulse width modulator;
   an over current protection circuit associated with the digital control loop further including:

first logic circuitry for generating an interrupt indicating an output current is greater than a threshold current; and second logic circuitry for blanking out current spikes in the output current occurring on a leading pulse edge of at least one of a plurality of outputs of the digital pulse-width modulator, said second logic circuitry including:

a leading edge blanker circuit for generating a switch output in a first mode and a second mode responsive to occurrence of the leading pulse edge of at least one of a plurality of outputs of the digital pulse-width modulator; and a switch connected to an input for the output current of the first logic circuitry responsive to the switch output in the first mode for opening the switch and responsive to the switch output in the second mode for closing the switch.

8. An apparatus comprising:

a switched power supply;

a digital control loop connected to the switched power supply, the digital control loop including a digital pulse width modulator;

an over current protection circuit associated with the digital control loop further including:

first logic circuitry for generating an interrupt indicating an output current is greater than a threshold current; and second logic circuitry for blanking out current spikes in the output current occurring on a leading pulse edge of at least one of a plurality of outputs of the digital pulse-width modulator;

wherein the at least one of the plurality of outputs of the digital pulse-width modulator that has current spikes blanked out there from is user programmable responsive to a control register input.

9. An apparatus comprising:

a switched power supply;

a digital control loop connected to the switched power supply, the digital control loop including a digital pulse width modulator;

an over current protection circuit associated with the digital control loop further including:

first logic circuitry for generating an interrupt indicating an output current is greater than a threshold current;

second logic circuitry for blanking out current spikes in the output current occurring on a leading pulse edge of at least one of a plurality of outputs of the digital pulse-width modulator; and a control register for controlling actuation of the second logic circuitry.

10. An apparatus comprising:

a switched power supply;

a digital control loop connected to the switched power supply, the digital control loop including a digital pulse width modulator;

an over current protection circuit associated with the digital control loop further including:

first logic circuitry for generating an interrupt indicating an output current is greater than a threshold current; and second logic circuitry for blanking out current spikes in the output current occurring on a leading pulse edge of at least one of a plurality of outputs of the digital pulse-width modulator;

wherein the second logic circuitry determines the leading pulse edge of at least one of the plurality of outputs responsive to an output for each of the plurality of outputs of the digital pulse-width modulator and an end-of-frame interrupt indicating an end of a frame.

11. The apparatus of claim 10, wherein the second logic circuitry determines a first edge occurring on at least one of the plurality of outputs after the end-of-frame interrupt as the leading pulse edge.

12. An apparatus comprising:

a switched power supply;

a digital control loop connected to the switched power supply, the digital control loop including a digital pulse width modulator;

an over current protection circuit associated with the digital control loop further including:

first logic circuitry for generating an interrupt indicating an output current is greater than a threshold current, the first logic circuitry comprising a comparator for comparing the detected output current to the threshold current and for generating the interrupt indicating the detected output current is greater than the threshold current and a digital to analog converter for providing the threshold current; and second logic circuitry for blanking out current spikes in the output current occurring on a leading pulse edge of at least one of a plurality of outputs of the digital pulse-width modulator.

* * * * *